United States Patent
Zhang et al.

(10) Patent No.: US 10,176,058 B2
(45) Date of Patent: Jan. 8, 2019

(54) METHOD AND APPARATUS FOR DATA BACKUP IN STORAGE SYSTEM

(71) Applicant: HUAWEI TECHNOLOGIES CO., LTD., Shenzhen, Guangdong (CN)

(72) Inventors: Chengwei Zhang, Chengdu (CN); Chuanshuai Yu, Chengdu (CN); Zongquan Zhang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/909,613

(22) Filed: Mar. 1, 2018

(65) Prior Publication Data

US 2018/0189151 A1   Jul. 5, 2018

Related U.S. Application Data

(63) Continuation of application No. PCT/CN2015/095562, filed on Nov. 25, 2015.

(51) Int. Cl.
G06F 3/06 (2006.01)
G06F 11/14 (2006.01)
(Continued)

(52) U.S. Cl.
CPC .......... G06F 11/1469 (2013.01); G06F 3/064 (2013.01); G06F 3/065 (2013.01);
(Continued)

(58) Field of Classification Search
CPC ............. G06F 2201/84; G06F 11/1431; G06F 11/1464; G06F 11/1471; G06F 11/1458;
(Continued)

(56) References Cited

U.S. PATENT DOCUMENTS

| 7,200,603 | B1 | 4/2007 | Hitz et al. | |
| 2009/0182963 | A1* | 7/2009 | Prahlad | G06F 11/1435 711/162 |
| 2010/0122053 | A1* | 5/2010 | Prahlad | G06F 17/30212 711/162 |
| 2012/0084523 | A1* | 4/2012 | Littlefield | G06F 11/1469 711/162 |

(Continued)

FOREIGN PATENT DOCUMENTS

| CN | 1132372 A | 10/1996 |
| CN | 1949761 A | 4/2007 |

(Continued)

OTHER PUBLICATIONS

Zou De-qing et al. Optimization research of hot standy with Remus, Journal of Shandong University( Natural Science), vol. 49 No. 9, Sep. 2014. with English translation. Total 26 pages.

*Primary Examiner* — Hiep T Nguyen
(74) *Attorney, Agent, or Firm* — Leydig, Voit & Mayer, Ltd.

(57) ABSTRACT

Embodiments of the present disclosure disclose a solution for data backup and recovery in a storage system. When a source device in the storage system backs up, to a backup-end device, a data block that is written after a snapshot $S_n$, the source device performs a logical operation such as an exclusive-NOR or exclusive-OR operation on the written data block and an original data block, which is recorded in the snapshot $S_n$, of the written data block, and then compresses a data block obtained after the logical operation, which improves a compression ratio of a data block, thereby reducing an amount of data that is sent to the backup-end device, and saving transmission bandwidth. The solution may be further applied to a scenario of data recovery in a storage system.

8 Claims, 7 Drawing Sheets

(51) Int. Cl.
*H03M 7/46* (2006.01)
*H03M 13/15* (2006.01)
*G06F 11/20* (2006.01)

(52) U.S. Cl.
CPC .......... *G06F 3/0608* (2013.01); *G06F 3/0619* (2013.01); *G06F 11/14* (2013.01); *G06F 11/1451* (2013.01); *G06F 11/1453* (2013.01); *G06F 11/1458* (2013.01); *G06F 11/2094* (2013.01); *H03M 7/46* (2013.01); *H03M 13/15* (2013.01)

(58) Field of Classification Search
CPC .... G06F 11/3476; G06F 3/065; G06F 3/0619; G06F 17/30371; G06F 17/30575; G06F 11/1469; G06F 11/14; G06F 11/1451; G06F 11/2094; G06F 3/0608; G06F 3/064; H03M 7/46; H03M 13/15
See application file for complete search history.

(56) References Cited

U.S. PATENT DOCUMENTS

| | | | |
|---|---|---|---|
| 2012/0124306 A1* | 5/2012 | Abercrombie | G06F 11/1461 711/162 |
| 2014/0173177 A1 | 6/2014 | Benhase et al. | |
| 2014/0181034 A1 | 6/2014 | Harrison et al. | |
| 2016/0196186 A1* | 7/2016 | Yang | G06F 11/1451 711/162 |
| 2018/0113623 A1* | 4/2018 | Sancheti | G06F 3/065 |

FOREIGN PATENT DOCUMENTS

| | | |
|---|---|---|
| CN | 102014152 A | 4/2011 |
| CN | 103095843 A | 5/2013 |
| CN | 103744751 A | 4/2014 |
| EP | 017353 A2 | 6/1996 |

\* cited by examiner

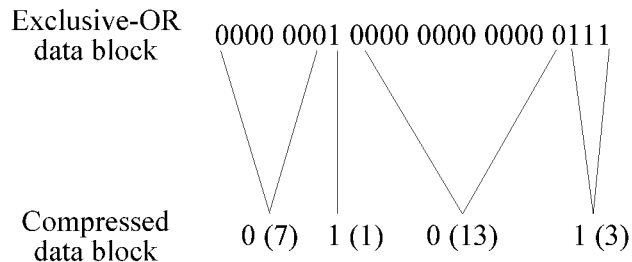
FIG. 5
| Data packet (original field) | 601 | 602 | 603 | 604 |
FIG. 6
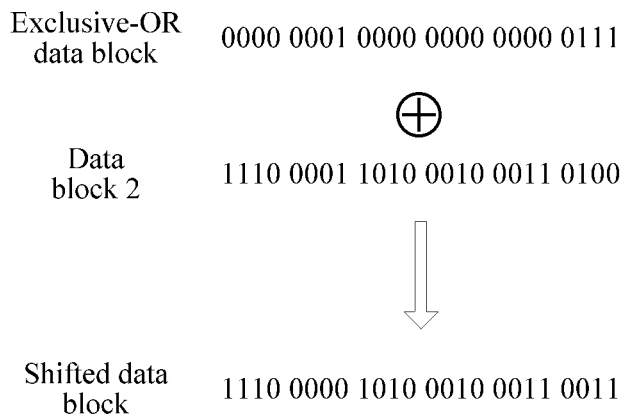
FIG. 7
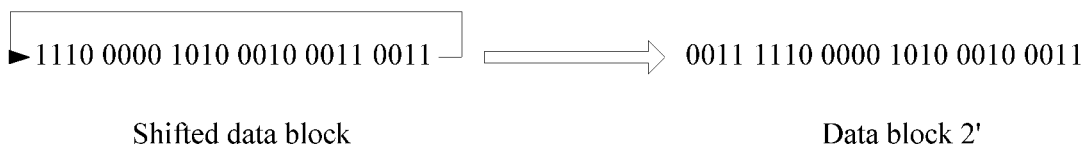
FIG. 8

METHOD AND APPARATUS FOR DATA BACKUP IN STORAGE SYSTEM

CROSS-REFERENCE TO RELATED APPLICATIONS

This application is a continuation of International Application No. PCT/CN2015/095562, filed on Nov. 25, 2015, the disclosure of which is hereby incorporated by reference in its entirety.

TECHNICAL FIELD

The present disclosure relates to the field of information technologies, and in particular, to a method and an apparatus for data backup in a storage system.

BACKGROUND

To ensure reliability of user data, a storage system generally provides a data copy function, to copy the user data from a source device of the storage system to a backup-end device. When a fault occurs in the source device, the data in the backup-end device is recovered to the source device, thereby achieving an objective of disaster recovery.

In the prior art, generally by using an incremental replication technology, data, which changes, in the source device is compressed and then backed up to the backup-end device. However, in the prior art, copying a data block, which changes, to a backup end still consumes a large amount of bandwidth.

SUMMARY

According to a first aspect, an embodiment of the present disclosure provides a solution for data backup in a storage system. The storage system includes a source device and a backup-end device, and data of an $n^{th}$ snapshot $S_n$ is stored in both the source device and the backup-end device. The source device determines a first data block that is written to the source device after the $n^{th}$ snapshot $S_n$, and determines, according to a logical block address of the first data block, a second data block that is in the same logical block address and that is recorded in the $n^{th}$ snapshot $S_n$ stored in the source device, where the first data block is a modified block of the second data block, where n indicates a snapshot operation. The source device performs a logical operation on the first data block and the second data block to obtain a third data block, and compresses the third data block to obtain a fourth data block. The source device sends, to the backup-end device, a data packet that carries the fourth data block, the logical block address of the first data block, and a version number of the $n^{th}$ snapshot $S_n$. The logical operation includes an exclusive-NOR operation or an exclusive-OR operation. The third data block is obtained by using the logical operation, and most data is the same between the first data block and the second data block. Therefore, the third data block includes a large quantity of 0s (for example, using an exclusive-OR operation) or 1s (for example, using an exclusive-NOR operation). A compression ratio of the third data block is greater than a compression ratio of the first data block. Compared with directly compressing the first data block and sending a compressed data block to the backup-end device, an amount of data that is sent to a backup end is reduced, and transmission bandwidth is saved.

The backup-end device receives and parses the data packet sent by the source device, to obtain the fourth data block, the logical block address of the first data block, and the version number of the $n^{th}$ snapshot $S_n$; and the backup-end device determines, according to the logical block address of the first data block and the version number of the $n^{th}$ snapshot $S_n$, the second data block recorded in the snapshot $S_n$ stored in the backup-end device, decompresses the fourth data block to obtain the third data block, performs the logical operation on the third data block and the second data block to obtain the first data block, and writes the first data block to the logical block address of the first data block.

Optionally, the determining, by the source device, a first data block that is written to the source device after the $n^{th}$ snapshot $S_n$ includes: determining, by the source device, the first data block according to a logical block address carried in a data write request recorded in a data change log after the $n^{th}$ snapshot $S_n$. In this implementation manner, the first data block can be determined without a need to perform a snapshot operation on the source device again.

Optionally, the determining, by the source device, a first data block that is written to the source device after the $n^{th}$ snapshot $S_n$ includes: performing, by the source device, an $x^{th}$ snapshot $S_x$ operation, comparing the snapshot $S_n$ with a snapshot $S_x$, and determining the first data block, where n and x are integers, and n<x.

The solution provided in the embodiment of the first aspect of the present disclosure may be also applied to data recovery. Data of an $n^{th}$ snapshot $S_n$ is stored in the source device, and the data of the $n^{th}$ snapshot $S_n$ in the source device and data of an $x^{th}$ snapshot $S_x$ are stored in the backup-end device, where n and x are integers, and n<x, where the source device sends a data recovery request to the backup-end device, where the data recovery request carries a version number of the snapshot $S_n$. The backup-end device receives and parses the data recovery request sent by the source device, to obtain the version number of the snapshot $S_n$, determines a first data block according to the version number of the snapshot $S_n$ and a version number of the snapshot $S_x$, determines, according to a logical block address of the first data block and the version number of the snapshot $S_n$, a second data block recorded in the snapshot $S_n$, performs a logical operation on the first data block and the second data block to obtain a third data block, compresses the third data block to obtain a fourth data block, and sends, to the source device, a data packet that carries the fourth data block and the logical block address of the first data block, where the first data block is a data block that is recorded in the snapshot $S_x$ backed up by the backup-end device and that is written by the source device after the $n^{th}$ snapshot $S_n$, and the first data block is a modified block of the second data block, where the logical operation is an exclusive-OR operation or an exclusive-NOR operation. In a data recovery process, a logical operation and a compression operation are performed, which similarly increases a compression ratio, and saves transmission bandwidth.

The source device receives and parses the data packet sent by the backup-end device, to obtain the fourth data block and the logical block address of the first data block, determines, according to the logical block address of the first data block, the second data block recorded in the snapshot $S_n$, decompresses the fourth data block to obtain the third data block, performs the logical operation on the third data block and the second data block to obtain the first data block, and writes the first data block to the logical block address of the first data block, so that the source device is recovered to a state that is the same as that of the backup-end device.

Corresponding to the first aspect and a data scenario to which the first aspect is applied, this embodiment of the present disclosure further provides a storage device, separately configured to serve as the source device and the backup-end device in the storage system in the embodiment in the first aspect, to implement the solution provided in the first aspect in the embodiments of the present disclosure. The storage device includes a structural unit that implements the solution in this embodiment of the present disclosure in the first aspect and in the data scenario to which the first aspect is applied, or the storage device includes an interface and a processor, to implement the solution in the embodiment in the first aspect and in the data scenario to which the first aspect is applied.

Accordingly, this embodiment of the present disclosure further provides a non-volatile computer readable storage medium and a computer program product. When a computer instruction included in the non-volatile computer readable storage medium and the computer program product is loaded into memory of the storage device provided in this embodiment of the present disclosure, and a central processing unit (CPU) of the storage device executes the computer instruction, the storage device serves as the source device and the backup-end device in the storage system in the embodiment of the first aspect, to implement the solution provided in the first aspect in the embodiments of the present disclosure.

According to a second aspect, an embodiment of the present disclosure further provides another solution for data backup in a storage system. The storage system includes a source device and a backup-end device, and data of an $n^{th}$ snapshot $S_n$ is stored in both the source device and the backup-end device. The source device determines a first data block that is written to the source device after the $n^{th}$ snapshot $S_n$, and determines, according to a logical block address of the first data block, a second data block recorded in the $n^{th}$ snapshot $S_n$, where the first data block is a modified block of the second data block. The source device determines a shift amount of a cyclic shift that needs to be performed on the first data block, and performs a cyclic shift on the first data block according to the shift amount to obtain a third data block. The third data block is obtained by performing the cyclic shift, so that at a same location, more data is the same between the third data block and the second data block. The source device performs a logical operation on the third data block and the second data block to obtain a fourth data block, where the logical operation is an exclusive-OR operation or an exclusive-NOR operation, and after the logical operation, the fourth data block includes a large quantity of 0s (for example, using an exclusive-OR operation) or 1s (for example, using an exclusive-NOR operation), and compresses the fourth data block to obtain a fifth data block. A compression ratio of the fourth data block is greater than a compression ratio of the first data block. Compared with directly compressing the first data block and sending a compressed data block to the backup-end device, an amount of data that is sent to a backup end is reduced, and transmission bandwidth is saved. The source device sends, to the backup-end device, a data packet that carries the fifth data block, the logical block address of the first data block, shift information, and a version number of the $n^{th}$ snapshot $S_n$, where the shift information includes a cyclic shift direction and the shift amount.

The backup-end device receives and parses the data packet to obtain the fifth data block, the logical block address of the first data block, the shift information, and the version number of the $n^{th}$ snapshot $S_n$; and determines, according to the logical block address of the first data block and the version number of the $n^{th}$ snapshot $S_n$, the second data block recorded in the snapshot $S_n$, decompresses the fifth data block to obtain the fourth data block, performs the logical operation on the fourth data block and the second data block to obtain the third data block, performs a reverse cyclic shift on the third data block according to the shift information to obtain the first data block, and writes the first data block to the logical block address of the first data block.

Optionally, the following calculation rule is configured for the source device: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows;

the source device performs hash calculation on at least partial data, which is in each window, of the first data block according to the calculation rule, and performs hash calculation on at least partial data, which is in each window, of the second data block according to the calculation rule;

the source device selects, according to an order in which hash values are set, the first M hash values from hash values of the first data block, and selects the first M hash values from hash values of the second data block, where M is a positive integer and is not greater than N; and the source device searches the first M hash values of the first data block and the first M hash values of the second data block for a same hash value, and determines that a difference between offsets of two windows corresponding to the same hash value is the shift amount.

Optionally, a fixed length that a start location of an $(i+1)^{th}$ window is away from a start location of an $i^{th}$ window is one bit or multiple bits.

Optionally, the order, in which the hash values are set, according to which the source device performs selection may be specifically an ascending order or a descending order.

Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed.

Optionally, the determining, by the source device, a first data block that is written to the source device after the $n^{th}$ snapshot $S_n$ includes: determining, by the source device, the first data block according to a logical block address carried in a data write request recorded in a data change log after the $n^{th}$ snapshot $S_n$. In this implementation manner, the first data block can be determined without a need to perform a snapshot operation on the source device again.

Optionally, the determining, by the source device, a first data block that is written to the source device after the $n^{th}$ snapshot $S_n$ includes: performing, by the source device, an $x^{th}$ snapshot $S_x$ operation, comparing the snapshot $S_n$ with a snapshot $S_x$, and determining the first data block, where n and x are integers, and n<x.

The solution provided in the embodiment of the second aspect of the present disclosure may be also applied to data recovery. A storage system includes a source device and a backup-end device, data of an $n^{th}$ snapshot $S_n$ is stored in the source device, and the data of the $n^{th}$ snapshot $S_n$ in the source device and data of an $x^{th}$ snapshot $S_x$ are stored in the backup-end device, where n and x are integers, and n<x. The source device sends a data recovery request to the backup-end device, where the data recovery request carries a version number of the snapshot $S_n$; and the backup-end device receives and parses the data recovery request to obtain the version number of the snapshot $S_n$, determines a first data block according to the version number of the snapshot $S_n$ and a version number of the snapshot $S_x$, determines, according to a logical block address of the first data block and the version number of the snapshot $S_n$, a second data block recorded in the snapshot $S_n$, determines a shift amount of a cyclic shift that needs to be performed on the first data block, performs a cyclic shift on the first data block according to the shift amount to obtain a third data block, performs a logical operation on the third data block and the second data block to obtain a fourth data block, where the logical operation is an exclusive-OR operation or an exclusive-NOR operation, and after the logical operation, the fourth data block includes a large quantity of 0s (for example, using an exclusive-OR operation) or 1s (for example, using an exclusive-NOR operation), and compresses the fourth data block to obtain a fifth data block. A compression ratio of the fourth data block is greater than a compression ratio of the first data block. Compared with directly compressing the first data block and sending a compressed data block to the source device, an amount of data that is sent to the source device is reduced, and transmission bandwidth is saved. The backup-end device sends, to the source device, a data packet that carries the fifth data block, shift information, and the logical block address of the first data block, where the first data block is a data block that is recorded in the snapshot $S_x$ backed up by the backup-end device and that is written by the source device after the $n^{th}$ snapshot $S_n$, the first data block is a modified block of the second data block, the logical operation is an exclusive-OR operation or an exclusive-NOR operation, and the shift information includes a cyclic shift direction and the shift amount.

The source device receives and parses the data packet to obtain the fifth data block, the shift information, and the logical block address of the first data block, determines, according to the logical block address of the first data block, the second data block recorded in the snapshot $S_n$, decompresses the fifth data block to obtain the fourth data block, performs the logical operation on the fourth data block and the second data block to obtain the third data block, performs a reverse cyclic shift on the third data block according to the shift information to obtain the first data block, and writes the first data block to the logical block address of the first data block, so that the source device is recovered to a state that is the same as that of the backup-end device.

Optionally, the following calculation rule is configured for the backup-end device: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows;

the backup-end device performs hash calculation on at least partial data, which is in each window, of the first data block according to the calculation rule, and performs hash calculation on at least partial data, which is in each window, of the second data block according to the calculation rule;

the backup-end device selects, according to an order in which hash values are set, the first M hash values from hash values of the first data block, and selects the first M hash values from hash values of the second data block, where M is a positive integer and is not greater than N; and the backup-end device searches the first M hash values of the first data block and the first M hash values of the second data block for a same hash value, and determines that a difference between offsets of two windows corresponding to the same hash value is the shift amount.

Optionally, a fixed length that a start location of an $(i+1)^{th}$ window is away from a start location of an $i^{th}$ window is one bit or multiple bits.

Optionally, the order, in which the hash values are set, according to which the backup-end device performs selection may be specifically an ascending order or a descending order.

Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed.

Corresponding to the second aspect and a data scenario to which the second aspect is applied, this embodiment of the present disclosure further provides a storage device, separately configured to serve as the source device and the backup-end device in the storage system in the embodiment in the second aspect, to implement the solution provided in the second aspect in the embodiments of the present disclosure. The storage device includes a structural unit that implements the solution in this embodiment of the disclosure in the second aspect and in the data scenario to which the second aspect is applied, or the storage device includes an interface and a processor, to implement the solution in the embodiment in the second aspect and in the data scenario to which the second aspect is applied.

Accordingly, this embodiment of the present disclosure further provides a non-volatile computer readable storage medium and a computer program product. When a computer instruction included in the non-volatile computer readable storage medium and the computer program product is loaded into memory of the storage device provided in this embodiment of the present disclosure, and a central processing unit (CPU) of the storage device executes the computer instruction, the storage device serves as the source device and the backup-end device in the storage system in the embodiment of the second aspect, to implement the solution provided in the second aspect in the embodiments of the present disclosure.

BRIEF DESCRIPTION OF DRAWINGS

FIG. 5 is a schematic diagram of a compression operation according to an embodiment of the present disclosure;

FIG. 6 is a schematic diagram of a data packet according to an embodiment of the present disclosure;

FIG. 7 is a schematic diagram of an exclusive-OR shift operation according to an embodiment of the present disclosure;

FIG. 8 is a schematic diagram of a reverse cycle according to an embodiment of the present disclosure;

DESCRIPTION OF EMBODIMENTS

Figure 1:
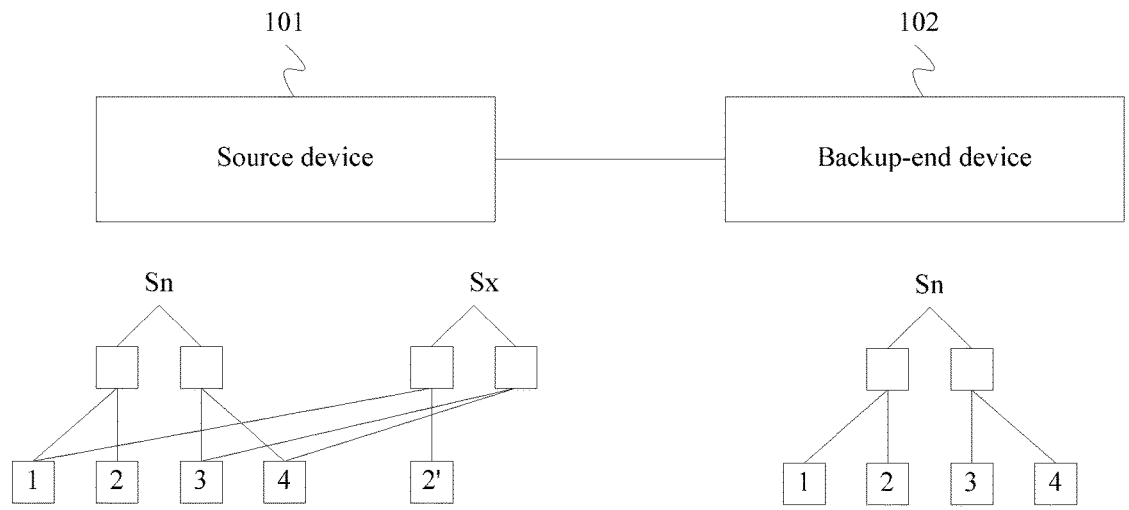
FIG. 1 is a schematic diagram of a storage system according to an embodiment of the present disclosure.

As shown in FIG. 1, a storage system includes a source device 101 and a backup-end device 102. At a moment of an $n^{th}$ snapshot $S_n$, a data block 1, a data block 2, a data block 3, and a data block 4 are stored in the source device 101. In the backup-end device 102, backup of the $n^{th}$ snapshot $S_n$ in the source device 101 is stored, that is, the data block 1, the data block 2, the data block 3, and the data block 4 are stored. After the $n^{th}$ snapshot $S_n$, the data block 2 in the source device 101 is modified to a data block 2'. According to a snapshot implementation mechanism, the data block 2 is stored in the snapshot $S_n$, and additionally the data block 2' is recorded, where the data block 2' is a data block obtained after the data block 2 is modified (that is, the data block 2' is a modified block of the data block 2). Data, which is at the moment of the snapshot $S_n$, in the source device 101 is already backed up in the backup-end device 102, and the backup-end device 102 has performed a snapshot $S_n$ operation, that is, a state at the moment of the snapshot $S_n$ is also recorded in the backup-end device 102 by using the snapshot $S_n$ operation. Therefore, when the data in the source device 101 is backed up to a backup end again, only the data block 2' needs to be backed up. Generally, to ensure that the data block 2' is not modified in a process of being backed up to the backup-end device 102, generally a snapshot operation needs to be performed on the source device 101, where the snapshot operation may be $S_x$, where n and x are integers, and n<x. As shown in FIG. 1, the data block 1, the data block 2', the data block 3, and the data block 4 that are stored in the source device 101 are recorded in the snapshot $S_x$. A logical block address, which is recorded in the snapshot $S_n$, of the data block 2 is the same as a logical block address, which is recorded in the snapshot $S_x$, of the data block 2', that is, the data block 2 and the data block 2' indicate states, which are at different moments, of the same logical block address. In this embodiment of the present disclosure, data recorded in a snapshot, stored data of a snapshot, or data of a snapshot indicates data that is stored in a device and that is recorded at a moment of the snapshot. The snapshot is a fully usable copy about a specified data set, and the copy includes an image, which is at a time point (a time point at which the copy starts), of the data. For a specific meaning, reference may be made to a definition in the Storage Networking Industry Association (SNIA). Generally, the snapshot has two implementation manners, that is, copy on write (COW) and redirect on write (ROW). Details are not described herein. Optionally, the data block 2' obtained after the modification may be determined by comparing the snapshot $S_x$ with the snapshot $S_n$. Optionally, a data block obtained after modification may be further determined by using a data change log (DCL). In a DCL manner, after the source device 101 records the $n^{th}$ snapshot $S_n$, the source device 101 receives a data write request, and parses the data write request to obtain a logical block address carried in the data write request. When the address carried in the received data write request is a logical block address of a data block recorded in the $n^{th}$ snapshot $S_n$, the data block is modified. Using FIG. 1 as an example, after the source device 101 records the $n^{th}$ snapshot $S_n$ by using the DCL, if the data write request received by the source device 101 carries the logical block address of the data block 2, it is determined that the data block 2 is modified.

Step 1: A source device 101 determines that a data block 2' is a modified block, which is obtained after an $n^{th}$ snapshot $S_n$, of a data block 2.

In this embodiment of the present disclosure, an example in which the data block 2' is 0011 1110 0000 1010 0010 0011 (for the convenience of reading, content of the data block 2' is shown in a unit of four bits) is used.

Step 2: The source device determines, according to a logical block address of the data block 2', the data block 2 recorded in the $n^{th}$ snapshot $S_n$.

In this embodiment of the present disclosure, the data block 2 is 1110 0001 1010 0010 0011 0100.

Step 3: Determine a shift amount of a cyclic shift of the data block 2', and perform a cyclic shift on the data block 2' according to the shift amount.

Figure 2A:
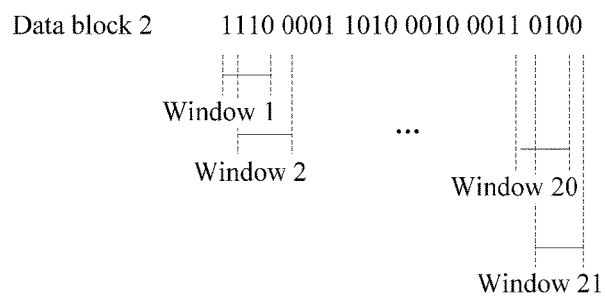
FIG. 2a is a schematic diagram of a method for determining a shift amount according to an embodiment of the present disclosure.
Figure 2A:
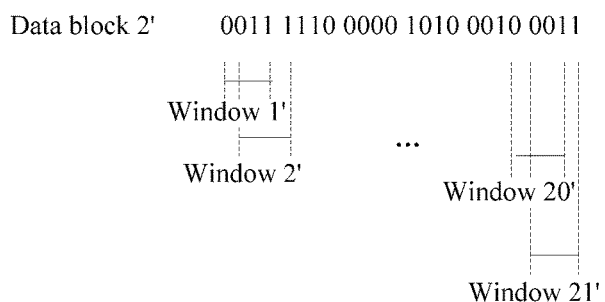

Optionally, as shown in FIG. 2a, the following calculation rule is configured for the source device 101: N windows are set, and hash calculation is performed on at least partial data, which is in each window, of a data block, where a size of each window is the same; a start location of a first window is a start location of the data block; an end location of a last window is an end location of the data block; a start location of an (i+1) window is a fixed length away from a start location of an $i^{th}$ window; and N is an integer and is not less than 2, i is an integer, and the $i^{th}$ window indicates any window of a first to an $N^{th}$ windows.

Figure 3:
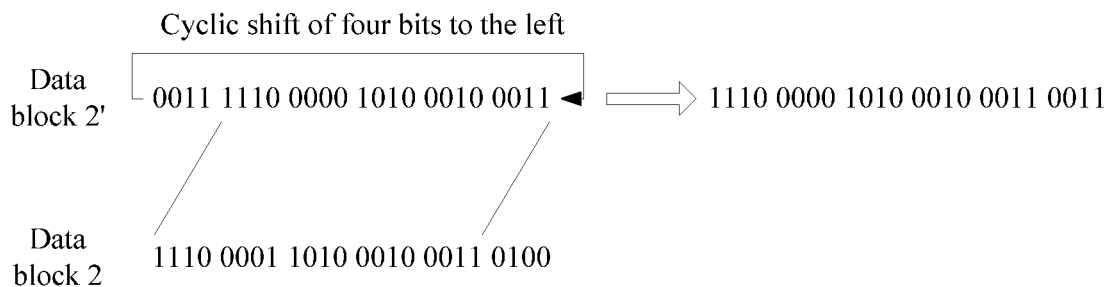
FIG. 3 is a schematic diagram of a cyclic shift according to an embodiment of the present disclosure.

According to the foregoing calculation rule, for example, 21 windows (for example, a size of a window is four bits) are set, start locations of adjacent windows are one bit away from each other (that is, a start location of an $(i+1)^{th}$ window is one bit away from a start location of an $i^{th}$ window), and the source device 101 performs hash calculation on at least partial data, which is in each window, of the data block 2, and performs hash calculation on at least partial data, which is in each window, of the data block 2'; and in a descending order of hash values, the first four hash values, which are respectively A, B, C, and D, are selected from the 21 windows of the data block 2, where windows corresponding to the four hash values are respectively a window 1, a window 3, a window 9, and a window 11, and offsets corresponding to the window 1, the window 3, the window 9, and the window 11 are respectively 0, 2, 8, and 10. An offset corresponding to a window refers to a quantity of bits that a start location of the window is away from a start location of a data block. For example, in the data block 2, a start location of the window 1 is zero bits away from a start location of the data block 2, and a start location of the window 3 is two bits away from the start location of the data block 2. Similarly, in a descending order of hash values, the first four hash values, which are respectively A, E, C, and D, are selected from 21 windows of the data block 2', where windows corresponding to the four hash values are respectively a window 5', a window 17', a window 13', and a window 15', and offsets corresponding to the window 5', the window 17', the window 13', and the window 15' are and are respectively 4, 16, 12, and 14. The source device 101 searches for same hash values in the two groups, that is, hash values A, C, and D. The source device 101 determines that a difference between offsets of windows corresponding to the same hash values is used as a shift amount. If a difference between offsets of the window 1 and the window 5' whose hash values are A is 4, and a difference between offsets of the window 9 and the window 13' whose hash values are C is 4, it indicates that content is likely the same between the two data blocks but there is a staggered position phenomenon, and by using a cyclic shift of four bits to the left, it can be ensured that same content of the two data blocks is aligned with each other. If the offset difference obtained by using the foregoing method is −4, a cyclic shift of four bits to the right is performed. When all hash values in the two groups are the same, and offsets corresponding to the same hash values are also the same, it indicates that no shift is needed, that is, a cyclic shift of zero bits is performed. In this embodiment of the present disclosure, that four hash values are selected in a descending order of hash values is only exemplary. Optionally, a fixed length that a start location of an $(i+1)^{th}$ window is away from a start location of an $i^{th}$ window may also be multiple bits. Optionally, selection may also be performed in an ascending order of hash values. As shown in FIG. 3, in this embodiment of the present disclosure, if it is determined that the data block 2' is four bits away from the data block 2, a cyclic shift of four bits to the left is performed on the data block 2', to obtain a data block after the shift (which is referred to as a shifted data block), that is, 1110 0000 1010 0010 0011 0011. The so-called cyclic shift is a computer term, and refers to that when a shift to an end is performed, bits within an original range before the shift are not lost, but are used as shift-in bits of the other end. For example, a cyclic shift of four bits to the left is performed, and 0011 is used as shift-in bits of the right end.

Figure 2B:
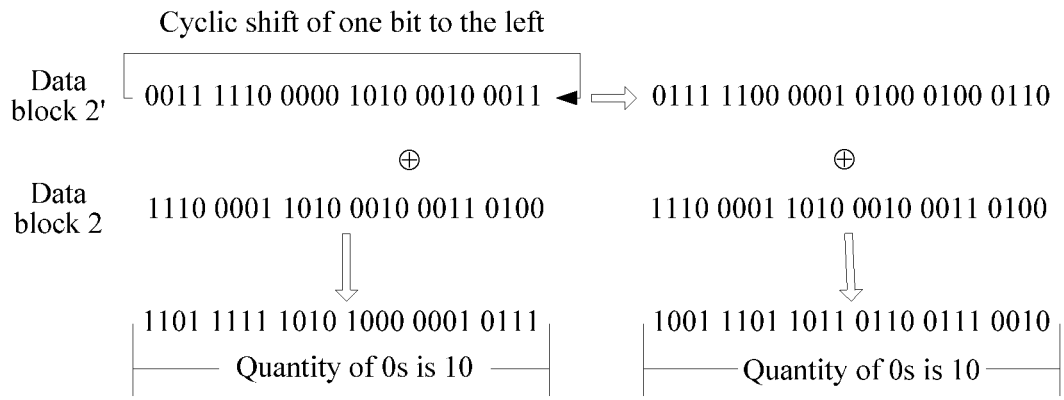
FIG. 2b is a schematic diagram of a method for determining a shift amount according to an embodiment of the present disclosure.

Optionally, as shown in FIG. 2b, at first, an exclusive-OR operation is performed on the data block 2' and the data block 2, to obtain an exclusive-OR data block a1, and obtain that a quantity of 0s included in the exclusive-OR data block a1 is 10; and then a cyclic shift of one bit to the left is performed on the data block 2', and an exclusive-OR operation is performed on a data block obtained by performing the cyclic shift of one bit to the left and the data block 2, to obtain an exclusive-OR data block a2, and obtain that a quantity of 0s included in the exclusive-OR data block a2 is 10. A cyclic shift to the left is performed according to the foregoing rule, until a cyclic shift of 23 bits to the left is performed on the data block 2', and an exclusive-OR operation is performed on a data block obtained by performing the cyclic shift of 23 bits to the left and the data block 2, to obtain an exclusive-OR data block a23 and determine a quantity of 0s included in the exclusive-OR data block a23. An exclusive-OR data block that includes a maximum quantity of 0s is determined from exclusive-OR data blocks a1 to a23, and in this embodiment of the present disclosure, is an exclusive-OR data block a5; and then it is determined that a cyclic shift of four bits to the left is performed on the data block 2'. If the exclusive-OR data block a1 is all-0 data, a cyclic shift does not need to be performed. It can be known from the foregoing descriptions that a larger quantity of 0s in data obtained by an exclusive-OR operation indicates a larger amount of data that is the same between two data blocks.

By using a cyclic shift, more data is the same between the data block 2 and a shifted data block obtained by shifting the data block 2', so that a data block obtained by a subsequent exclusive-OR operation includes more bits that are 0s. When a cyclic shift is not needed, that is, each bit is the same between the data block 2' and the data block 2, a cyclic shift of zero bits is performed.

Figure 4:
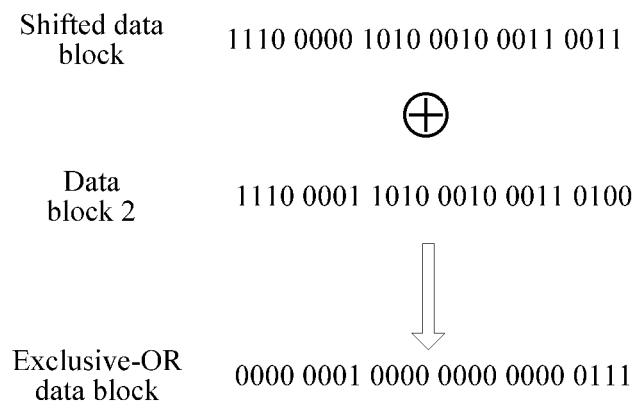
FIG. 4 is a schematic diagram of an exclusive-OR operation according to an embodiment of the present disclosure.

Step 4: Perform an exclusive-OR operation on a shifted data block and the data block 2, to obtain a data block (that is, an exclusive-OR data block) of 0000 0001 0000 0000 0000 0111, specifically as shown in FIG. 4.

Step 5: The source device 101 performs a compression operation on the obtained exclusive-OR data block.

The source device 101 may specifically perform the compression operation on the exclusive-OR data block by using an LZ4 compression algorithm, a ZLIB compression algorithm, a run-length encoding (RLE) compression algorithm, and the like, which is not limited in this embodiment of the present disclosure.

An example in which the source device 101 compresses the exclusive-OR data block by using the RLE compression algorithm is used. In an embodiment manner shown in FIG. 5, the RLE algorithm traverses the exclusive-OR data block from the left to the right, and replaces continuously repeated data with a quantity of appearance times; and then a compressed exclusive-OR data block is indicated as follows: 0(7)1(1) 0(13)1(3), where 0(7) indicates that 0 continuously appears seven times, 1(1) indicates that 1 continuously appears once, 0(13) indicates that 0 continuously appears 13 times, and 1(3) indicates that 1 continuously appears three times. The foregoing indication manner is for the convenience of understanding and distinguishing, and for actual implementation, reference may be made to RLE compression algorithm descriptions (refer to https://en.wikipedia.org/wiki/Run-length_encoding).

Compared with directly compressing a data block that is modified, by using the foregoing steps, an amount of data that is sent by the source device 101 to the backup-end device 102 is reduced, thereby saving transmission bandwidth.

Step 6: The source device 101 encapsulates a compressed data block in a data packet, and sends the data packet to a backup-end device 102, where the data packet carries the logical block address of the data block 2', shift information of the data block 2', the compressed data block, and a version number of the snapshot $S_n$. The shift information includes a cyclic shift direction and the shift amount.

In this embodiment of the present disclosure, a protocol for sending a data packet of backup data is not limited. In an implementation manner, as shown in FIG. 6, four fields 601, 602, 603, and 604 are added to an original data packet. 601 is used to indicate the logical block address of the data block 2', and is also the logical block address of the data block 2; 602 indicates the version number of the $n^{th}$ snapshot $S_n$; 603 is used to indicate the shift information (in this embodiment of the present disclosure, the shift amount is four bits by which a cyclic shift to the left is performed) of the data block 2'; and 604 is used to carry the compressed data block. In specific implementation, an order of the fields is not limited. In the field 603, a cyclic shift manner may be indicated by using a first bit, for example, 0 indicates a cyclic shift to the left, and 1 indicates a cyclic shift to the right; a bit other than the first bit indicates a shift amount of a cyclic shift, or a cyclic shift to a direction by default. A version number of a snapshot is an identifier of the snapshot. An implementation is that the version number linearly increases as snapshots increase.

Step 7: The backup-end device 102 receives and parses the data packet, to obtain the logical block address of the data block 2', the shift information of the data block 2', the compressed data block, and the version number of the snapshot $S_n$ that are carried in the data packet.

Specifically, when the data packet shown in FIG. 6 is used as an example, the backup-end device 102 parses the data packet to obtain information in the fields 601, 602, 603, and 604. The backup-end device 102 decompresses the compressed data block carried in the field 604. The compressed data block carried in the field 604 is obtained by using the RLE compression algorithm, and therefore 0(7)1 0(13)1(3) is decompressed to obtain 0000 0001 0000 0000 0000 0111, that is, the exclusive-OR data block at an end of the source device 101. According to the logical block address, which is carried in the field 601, of the modified data block 2' and the version number, which is carried in the field 602, of the $n^{th}$ snapshot $S_n$, the backup-end device 102 determines the data block 2 recorded in the $n^{th}$ snapshot $S_n$ in the backup-end device 102, to obtain the data block 2 of 1110 0001 1010 0010 0011 0100. As shown in FIG. 7, the backup-end device 102 performs an exclusive-OR operation on the data block 2 and the exclusive-OR data block, to obtain a shifted data block of 1110 0000 1010 0010 0011 0011 in the source device 101, that is, a data block obtained after the data block 2' is shifted. The backup-end device 102 performs a reverse cyclic shift according to the shift information carried in the field 603. As shown in FIG. 8, in this embodiment of the present disclosure, the reverse cyclic shift is a cyclic shift of four bits to the right, to obtain the data block 2' in the source device 101.

Step 8: The backup-end device 102 writes the data block 2' to the logical block address, of the data block 2', carried in the data packet received from the source device 101.

In specific implementation, the backup-end device 102 and the source device 101 have a same logical block address, and therefore the logical block address of the data block 2' is stored in the backup-end device 102 and the logical block address of the data block 2' is stored in the source device 101. In the foregoing solution, the backup-end device 102 modifies, according to the logical block address of the data block 2', the data block 2 of data blocks stored in the backup-end device 102, to obtain the data block 2', so that the data block 1, the data block 2', the data block 3, and the data block 4 are stored in the backup-end device 102.

The backup-end device 102 already performs a snapshot operation on the data block 1, the data block 2, the data block 3, and the data block 4, to obtain the snapshot $S_n$ in the backup-end device 102. Therefore, when the backup-end device 102 modifies the stored data block 2 to obtain the data block 2', the data block 2 is maintained at the same time.

Figure 9:
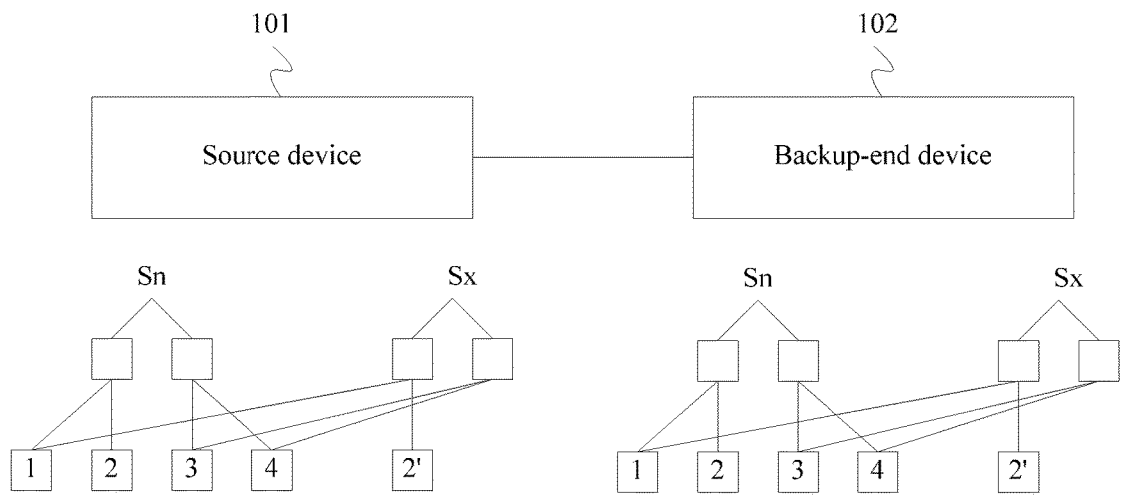
FIG. 9 is a schematic diagram of a storage system after data backup according to an embodiment of the present disclosure.

After step 8, the backup-end device 102 performs an $x^{th}$ snapshot operation on the backup end, to obtain a snapshot $S_x$. Specifically as shown in FIG. 9, an example in which data stored in the backup-end device 102 at a moment of the snapshot $S_x$ includes the data block 1, the data block 2', the data block 3, and the data block 4 is used. A logical block address, which is recorded in the snapshot $S_n$, of the data block 2 is the same as a logical block address, which is recorded in the snapshot $S_x$, of the data block 2', that is, the data block 2 and the data block 2' indicate states, which are at different moments, of the same logical block address.

When a fault occurs in the source device 101 to cause a data loss, recovery may be performed by using snapshot data in the backup-end device 102. In this embodiment of the present disclosure, the source device 101 may be recovered to a state at the moment of the $x^{th}$ snapshot $S_x$ by using the backup-end device 102. For example, if the source device 101 loses, due to a fault, the data block 2' (that is, a data block obtained after the data block 2 is modified) recorded in the snapshot $S_x$, and has only data at the moment of the snapshot $S_n$ (or referred to as a state at the moment of the snapshot $S_n$), the source device 101 sends a data recovery request to the backup-end device 102, where the data recovery request carries a version number of the current snapshot $S_n$ in the source device 101. Therefore, the backup-end device 102 determines, according to the version number, which is carried in the data recovery request, of the current snapshot $S_n$ in the source device 101, that the source device 101 has only the data at the moment of the snapshot $S_n$. In a first implementation manner, the backup-end device 102 determines, according to the version number of the current snapshot $S_n$ in the source device 101, that data needing to be recovered is the data block 2', and sends the logical block address of the data block 2' and the data block 2' to the source device 101. The source device 101 receives the logical block address of the data block 2' and the data block 2', and writes the data block 2' to the logical block address of the data block 2' in the source device 101, thereby recovering the source device 101 to the state at the moment of the $x^{th}$ snapshot $S_x$. Specifically, reference may be made to an existing solution for recovering data in a source device based on a snapshot. Details are not described herein.

In another implementation manner, the backup-end device 102 determines, according to the data recovery request sent by the source device 101, that data needing to be recovered is the data block 2', and the backup-end device 102 determines, according to the logical block address of the data block 2', the data block 2 recorded in the snapshot $S_n$. The backup-end device 102 determines a shift amount of a cyclic shift of the data block 2', performs a cyclic shift on the data block 2' according to the shift amount, to obtain a shifted data block, performs an exclusive-OR operation on the shifted data block and a data block, to obtain a compressed data block, encapsulates the compressed data block, the logical block address of the data block 2', the version number of the $n^{th}$ snapshot $S_n$, and the shift information of the data block 2' in a data packet, and sends the data packet to the source device 101. For specific implementation, reference may be made to steps 2 to 7. For a specific format of the data packet, reference may be made to FIG. 6. Compared with the first implementation manner, an amount of data sent by the backup-end device 102 to the source device 101 in a data recovery process is reduced, and transmission bandwidth is saved. The source device 101 receives and parses the data packet sent by the backup-end device 102, and performs an exclusive-OR operation, a reverse cyclic shift operation, and a data write operation according to the received packet, to obtain the data block 2'. For specific implementation, reference may be made to step 7 and step 8. The data block 2' is written to the logical block address of the data block 2', thereby recovering the source device 101 to the state at the moment of the snapshot $S_x$.

Another embodiment of the present disclosure provides another implementation manner in which the source device 101 backs up the data block 2' to the backup-end device 102. Step 1' and step 2' are respectively similar to steps 1 and 2. Details are not described herein.

Step 3': Perform an exclusive-OR operation on the data block 2' and the data block 2, to obtain an exclusive-OR data block of 1101 1111 1010 1000 0001 0111. For a specific exclusive-OR operation, reference may be made to FIG. 4.

Step 4': Compress the exclusive-OR data block of 1101 1111 1010 1000 0001 0111. For specific implementation, reference may be made to the description in step 5. Details are not described herein.

Step 5': The source device 101 encapsulates a compressed data block in a data packet, and sends the data packet to the backup-end device 102. The data packet carries the logical block address of the data block 2', the compressed data block, and the version number of the snapshot $S_n$.

For specific implementation, reference may be made to FIG. 6. The data packet includes the fields 601, 602, and 604 (a cyclic shift operation is not needed, and therefore the field 603 is not needed). 601 is used to indicate the logical block address of the data block 2', which is also the logical block address of the data block 2; 602 indicates the version number of the $n^{th}$ snapshot $S_n$; and 604 is used to carry the compressed data block. In specific implementation, an order of the fields is not limited.

Step 6': The backup-end device 102 receives and parses the data packet, to obtain information in the fields 601, 602, and 604. The backup-end device 102 decompresses the compressed data block carried in the field 604. According to the logical block address, which is carried in the field 601, of the modified data block 2' and the version number, which is carried in the field 602, of the $n^{th}$ snapshot $S_n$, the backup-end device 102 determines the data block 2 recorded in the $n^{th}$ snapshot $S_n$ in the backup-end device 102, and the backup-end device 102 performs an exclusive-OR operation on the data block 2 and the exclusive-OR data block of 1101 1111 1010 1000 0001 0111, to obtain the data block 2'.

Step 7' is similar to step 8. Details are not described herein.

In another implementation manner in which the backup-end device 102 performs data recovery on the source device 101, the backup-end device 102 determines, according to the data recovery request sent by the source device 101, that data needing to be recovered is the data block 2', and the backup-end device 102 finds, according to the logical block address of the data block 2', the data block 2 recorded in the snapshot $S_n$. The backup-end device 102 obtains the compressed data block by separately using previous manners in which the source device 101 performs steps 3' and 4'. The backup-end device 102 encapsulates the compressed data block, the logical block address of the data block 2', and the version number of the $n^{th}$ snapshot $S_n$ in a data packet, and sends the data packet to the source device 101. For a specific format of the data packet, reference may be made to step 5'. Therefore, an amount of data sent by the backup-end device 102 to the source device 101 in a data recovery process is reduced, and transmission bandwidth is saved. The source device 101 receives and parses the data packet sent by the backup-end device 102, obtains the data block 2' in a manner in step 6' and step 7' that are performed by the backup-end device 102, and writes the data block 2' to the logical block address of the data block 2', thereby recovering the source device 101 to the state at the moment of the snapshot $S_x$.

The exclusive-OR operation in the embodiments of the present disclosure may be also replaced with an exclusive-NOR operation, and a same effect can be achieved. Specifically, in an implementation manner for determining a shift amount, if an exclusive-NOR operation is used, the exclusive-NOR operation is performed on the data block 2' and the data block 2, to obtain an exclusive-NOR data block a1, and obtain a quantity of 1s included in the exclusive-NOR data block a1; and then a cyclic shift of one bit to the left is performed on the data block 2', and an exclusive-NOR operation is performed on the data block 2 and a data block obtained by performing the cyclic shift of one bit to the left, to obtain an exclusive-NOR data block a2, and obtain a quantity of 1s included in the exclusive-NOR data block a2. A cyclic shift to the left is performed according to the foregoing rule, until a cyclic shift of 23 bits to the left is performed on the data block 2', and exclusive-NOR is performed on the data block 2 and a data block obtained by performing the cyclic shift of 23 bits to the left, to obtain an exclusive-NOR data block a23 and determine a quantity of 1s included in the exclusive-NOR data block a23. An exclusive-NOR data block that includes a maximum quantity of 1s is determined from exclusive-NOR data blocks a1 to a23, and in this embodiment of the present disclosure, is an exclusive-NOR data block a5; and then it is determined that a cyclic shift of four bits to the left is performed on the data block 2'. If the exclusive-NOR data block a1 is all-1 data, a cyclic shift does not need to be performed.

The data backup method described in the embodiments of the present disclosure and the data recovery method in this embodiment of the present disclosure may be used in combination, or may be used independently.

Figure 10:
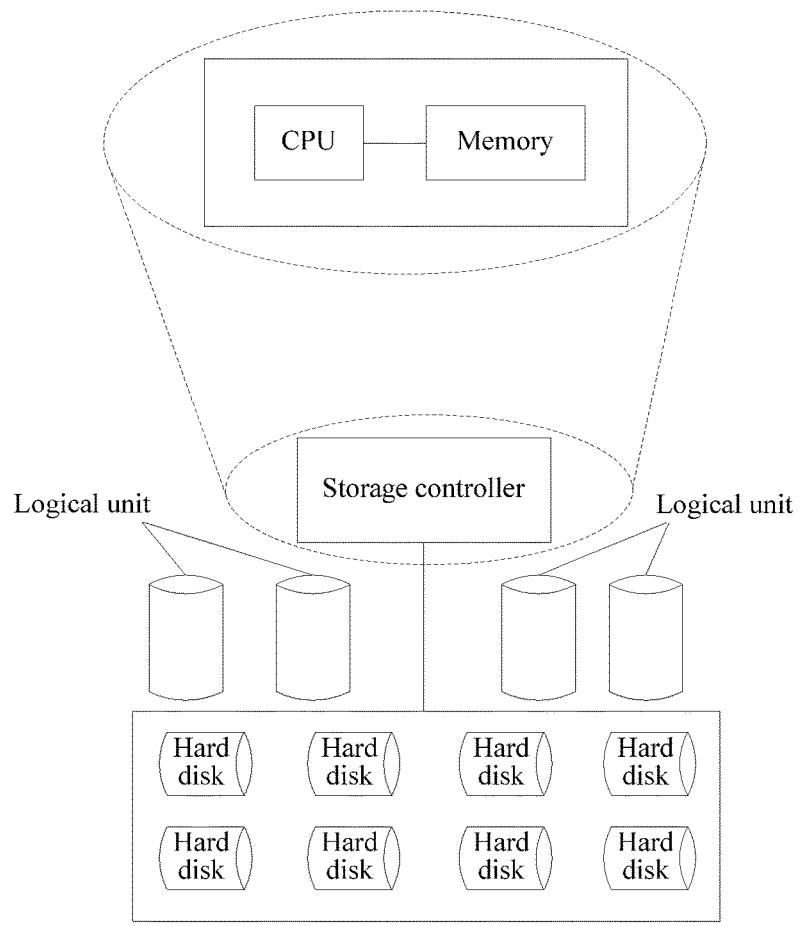
FIG. 10 is a schematic diagram of an application scenario according to an embodiment of the present disclosure.

The source device 101 and the backup-end device 102 in this embodiment of the present disclosure may be storage arrays. That is, the source device 101 is a source storage array, and the backup-end device 102 is a backup-end storage array. A structure of a storage array is shown in FIG. 10, and includes a storage controller and multiple hard disks. The storage controller includes a central processing unit (CPU) and memory. The CPU and the memory communicate with each other by using a bus, and the storage controller further includes an interface that communicates with a host and a hard disk. The storage controller performs logical combination on the hard disks, and divides the hard disks into different RAID groups according to a need. The storage controller divides an available capacity of a RAID group into relatively small units, which are referred to as logical units. A unique identifier is allocated to each logic unit, and is referred to as a logical unit number (LUN). The storage controller allocates a logic unit to the host for use, that is, exposes a LUN of the logic unit to the host. For specific implementation, reference may be made to a logic unit allocation technology in the field of storage technologies. In this embodiment of the present disclosure, backing up the source storage array may be backing up a data block in a logic unit in the storage array, or may be backing up multiple logic units. In a storage array scenario, that a modified data block is determined by using a DCL technology is specifically that a storage controller records a logical block address of the modified data block by parsing an address, which is carried in a data write request, of a data block, that is, records a logical block address (LBA) and a length, which are carried, of the data block. The field 601 shown in FIG. 6 carries an LBA and a length of the modified data block 2'.

Figure 11:
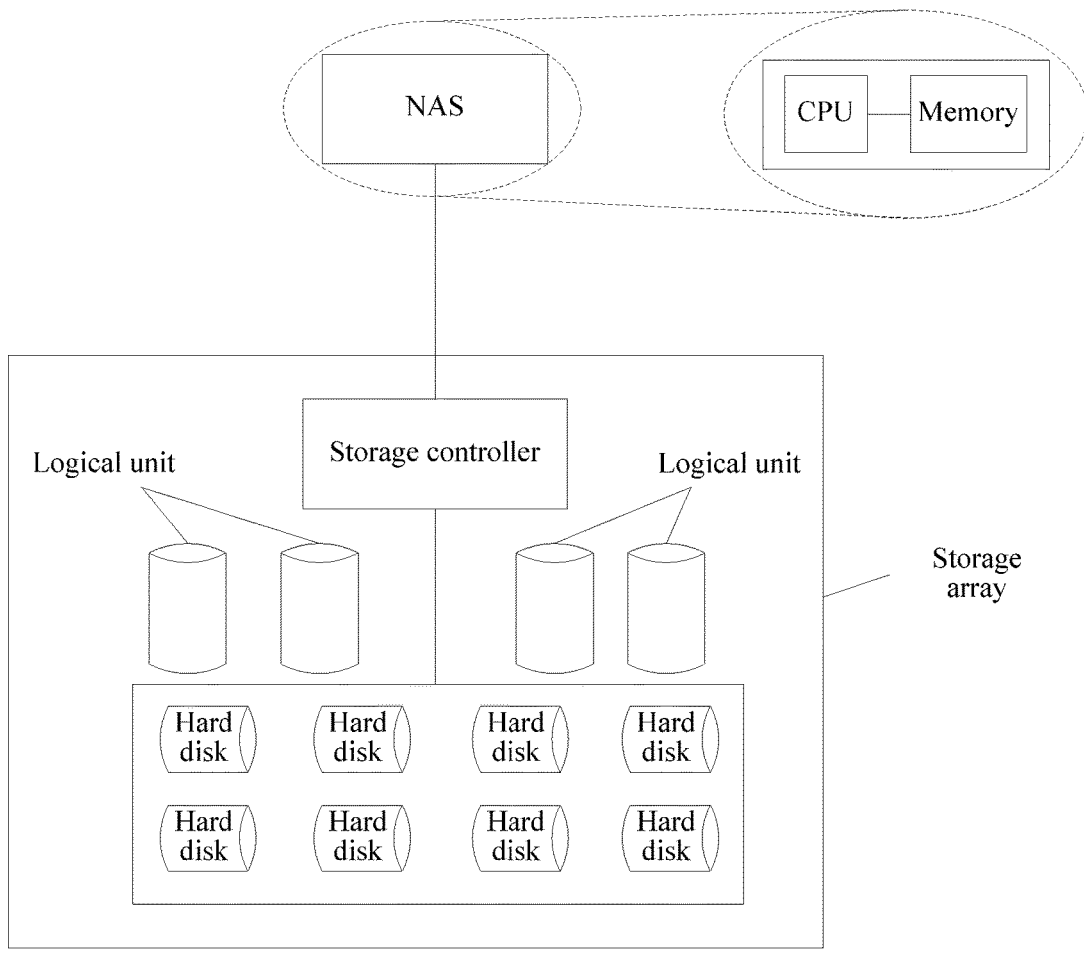
FIG. 11 is a schematic diagram of an application scenario according to an embodiment of the present disclosure.

The source device 101 and the backup-end device 102 in this embodiment of the present disclosure may be network attached storage (NAS), which includes a NAS header and a storage array (refer to FIG. 9), as shown in FIG. 11. The NAS header includes a CPU and memory, and the NAS header further includes a standard storage protocol and port in the storage industry, which are used to connect to and manage a physical magnetic disk resource. The CPU in the NAS header executes a file sharing protocol, to implement file access. Specifically, the file sharing protocol includes a network file system (NFS), a common Internet file system (CIFS), or the like. In this embodiment of the present disclosure, backing up source NAS may be backing up a file system in the NAS. In a NAS scenario, that a modified data block is determined by using the DCL technology is specifically that the NAS header records an address of the determined modified data block by parsing an address, which is carried in a data write request, of a data block, that is, records a file identifier, an offset, and a length that are carried. The field 601 shown in FIG. 6 carries a file identifier, an offset, and a length.

Figure 12:
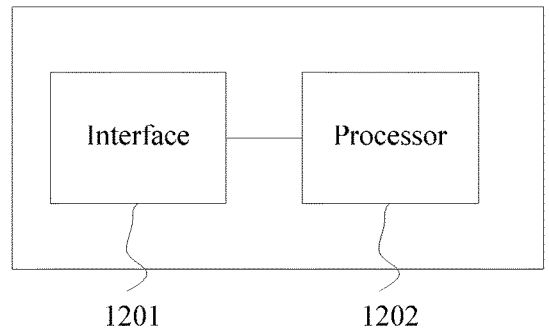
FIG. 12 is a schematic structural diagram of a storage device according to an embodiment of the present disclosure.

As shown in FIG. 12, an embodiment of the present disclosure provides a storage device, where the storage device is configured to serve as a source device 101 in a storage system, and the storage system further includes a backup-end device 102 of the source device 101. Reference may be made to the storage system shown in FIG. 1. Data of an $n^{th}$ snapshot $S_n$ is stored in both the storage device 101 and the backup-end device 102, where n is an integer. The storage device 101 includes an interface 1201 and a processor 1202, and the interface 1201 and the processor 1202 communicate with each other by using a bus. The processor 1202 is configured to determine a first data block that is written to the storage device 101 after the $n^{th}$ snapshot $S_n$; determine, according to a logical block address of the first data block, a second data block recorded in the $n^{th}$ snapshot $S_n$, where the first data block is a modified block of the second data block; perform a logical operation on the first data block and the second data block to obtain a third data block, where the logical operation is an exclusive-OR operation or an exclusive-NOR operation; and compress the third data block to obtain a fourth data block. The interface 1201 is configured to send, to the backup-end device 102, a data packet that carries the fourth data block, the logical block address of the first data block, and a version number of the $n^{th}$ snapshot $S_n$. Optionally, the processor 1202 is specifically configured to determine the first data block according to a logical block address carried in a data write request recorded in a data change log after the $n^{th}$ snapshot $S_n$. Optionally, the processor 1202 is specifically configured to perform an $x^{th}$ snapshot $S_x$ operation, compare the snapshot $S_n$ with a snapshot $S_x$, and determine the first data block, where n and x are integers, and n<x.

As shown in FIG. 12, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 1. Data of an $n^{th}$ snapshot $S_n$ is stored in both the storage device 102 and the source device 101, where n is an integer. The storage device 102 includes an interface 1201 and a processor 1202, and the interface 1201 and the processor 1202 communicate with each other by using a bus. The interface 1201 is configured to receive and parse a data packet sent by the source device 101, to obtain a fourth data block, a logical block address of a first data block, and a version number of the $n^{th}$ snapshot $S_n$. The processor 1202 is configured to determine, according to the logical block address of the first data block and the version number of the $n^{th}$ snapshot $S_n$, a second data block recorded in the snapshot $S_n$, where the first data block is a data block written by the source device after the $n^{th}$ snapshot $S_n$, and the first data block is a modified block of the second data block; decompress the fourth data block to obtain a third data block; perform a logical operation on the third data block and the second data block to obtain the first data block, where the logical operation is an exclusive-OR operation or an exclusive-NOR operation; and write the first data block to the logical block address of the first data block.

As shown in FIG. 12, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 9. Data of an $n^{th}$ snapshot $S_n$ is stored in both the storage device 102 and the source device 101, where n is an integer. The storage device 102 includes an interface 1201 and a processor 1202. The interface 1201 is configured to receive and parse a data recovery request sent by the source device 101, to obtain a version number of the snapshot $S_n$. The processor 1202 is configured to determine, according to the version number of the snapshot $S_n$ and a version number of a snapshot $S_x$, a first data block recorded in the snapshot $S_x$; and determine, according to a logical block address of the first data block and the version number of the snapshot $S_n$, a second data block that is recorded in the snapshot $S_n$ and that is stored in the logical block address, where the first data block is a data block that is recorded in the snapshot $S_x$ backed up by the storage device 102 and that is written by the source device 101 after the $n^{th}$ snapshot $S_n$, and the first data block is a modified block of the second data block; perform a logical operation on the first data block and the second data block to obtain a third data block, where the logical operation is an exclusive-OR operation or an exclusive-NOR operation; and compress the third data block to obtain a fourth data block. The interface 1201 is further configured to send, to the source device 101, a data packet that carries the fourth data block and the logical block address of the first data block.

As shown in FIG. 12, an embodiment of the present disclosure provides a storage device, where the storage device is configured to serve as a source device 101 in a storage system, and the storage system further includes a backup-end device 102 of the source device 101. Reference may be made to the storage system shown in FIG. 9. Data of an $n^{th}$ snapshot $S_n$ is stored in both the storage device 101 and the backup-end device 102, where n is an integer. The storage device 101 includes an interface 1201 and a processor 1202, and the interface 1201 and the processor 1202 communicate with each other by using a bus. The interface 1201 is configured to send a data recovery request to the backup-end device 102, where the data recovery request carries a version number of the snapshot $S_n$; and receive and parse a data packet that is sent by the backup-end device according to the data recovery request, to obtain a fourth data block and a logical block address of a first data block, where the first data block is a data block that is recorded in a snapshot $S_x$ backed up by the backup-end device 102 and that is written to the logical block address by the storage device 101 after the $n^{th}$ snapshot $S_n$. The processor 1202 is configured to determine, according to the logical block address of the first data block, a second data block recorded in the snapshot $S_n$ stored in the source device, where the first data block is a modified block of the second data block; decompress the fourth data block to obtain a third data block; perform a logical operation on the third data block and the second data block to obtain the first data block, where the logical operation is an exclusive-OR operation or an exclusive-NOR operation; and write the first data block to the logical block address of the first data block.

As shown in FIG. 12, an embodiment of the present disclosure provides a storage device, where the storage device serves as a source device 101 in a storage system, and the storage system further includes a backup-end device 102 of the source device 101. Reference may be made to the storage system shown in FIG. 1. Data of an $n^{th}$ snapshot $S_n$ is stored in both the source device 101 and the backup-end device 102, where n is an integer. The storage device 101 includes an interface 1201 and a processor 1202, and the interface 1201 and the processor 1202 communicate with each other by using a bus. The processor 1202 is configured to determine a first data block that is written to the source device after the $n^{th}$ snapshot $S_n$; determine, according to a logical block address of the first data block, a second data block recorded in the $n^{th}$ snapshot $S_n$, where the first data block is a modified block of the second data block; determine a shift amount of a cyclic shift that needs to be performed on the first data block; perform a cyclic shift on the first data block according to the shift amount to obtain a third data block; perform a logical operation on the third data block and the second data block to obtain a fourth data block, where the logical operation is an exclusive-OR operation or an exclusive-NOR operation; and compress the fourth data block to obtain a fifth data block. The interface 1201 is configured to send, to the backup-end device 102, a data packet that carries the fifth data block, the logical block address of the first data block, shift information, and a version number of the $n^{th}$ snapshot $S_n$, where the shift information includes a cyclic shift direction and the shift amount. Optionally, the following calculation rule is configured for the storage device 101: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows. The processor 1202 is specifically configured to perform hash calculation on at least partial data, which is in each window, of the first data block according to the calculation rule, and perform hash calculation on at least partial data, which is in each window, of the second data block according to the calculation rule; select, according to an order in which hash values are set, the first M hash values from hash values of the first data block, and select the first M hash values from hash values of the second data block, where M is a positive integer and is not greater than N; and search the first M hash values of the first data block and the first M hash values of the second data block for a same hash value, and determine that a difference between offsets of two windows corresponding to the same hash value is the shift amount. Optionally, a fixed length that a start location of an $(i+1)^{th}$ window is away from a start location of an $i^{th}$ window is one bit or multiple bits. Optionally, the order, in which the hash values are set, according to which the backup-end device performs selection may be specifically an ascending order or a descending order. Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed. Optionally, the processor 1202 is specifically configured to determine the first data block according to a logical block address carried in a data write request recorded in a data change log after the $n^{th}$ snapshot $S_n$. Optionally, the processor 1202 is specifically configured to perform an $x^{th}$ snapshot $S_x$ operation on the source device 101, compare the snapshot $S_n$ with a snapshot $S_x$, and determine the first data block, where n and x are integers, and n<x.

As shown in FIG. 12, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 1. Data of an $n^{th}$ snapshot $S_n$ is stored in both the source device 101 and the backup-end device 102, where n is an integer. The storage device 102 includes an interface 1201 and a processor 1202, and the interface 1201 and the processor 1202 communicate with each other by using a bus. The interface 1201 is configured to receive and parse a data packet sent by the source device 101, to obtain a fifth data block, a logical block address of a first data block, shift information, and a version number of the $n^{th}$ snapshot $S_n$. The processor 1202 is configured to determine, according to the logical block address of the first data block and the version number of the $n^{th}$ snapshot $S_n$, a second data block recorded in the snapshot $S_n$, where the first data block is a data block written by the source device after the $n^{th}$ snapshot $S_n$, and the first data block is a modified block of the second data block; decompress the fifth data block to obtain a fourth data block; perform a logical operation on the fourth data block and the second data block to obtain a third data block, where the logical operation is an exclusive-OR operation or an exclusive-NOR operation; perform a reverse cyclic shift on the third data block according to the shift information to obtain the first data block, where the shift information includes a shift amount and a cyclic shift direction that are needed by the source device 101 to perform a cyclic shift on the first data block to obtain the third data block; and write the first data block to the logical block address of the first data block.

As shown in FIG. 12, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 9. Data of an $n^{th}$ snapshot $S_n$ is stored in the source device 101, and the data of the $n^{th}$ snapshot $S_n$ in the source device and data of an $x^{th}$ snapshot $S_x$ are stored in the backup-end device 102, where n and x are integers, and n<x. The storage device 102 includes an interface 1201 and a processor 1202, and the interface 1201 and the processor 1202 communicate with each other by using a bus. The interface 1201 is configured to receive a data recovery request sent by the source device 101, where the data recovery request carries a version number of the snapshot $S_n$. The processor 1202 is configured to determine, according to the version number of the snapshot $S_n$ and a version number of the snapshot $S_x$, a first data block recorded in the snapshot $S_x$, where the first data block is a data block that is recorded in the snapshot $S_x$ backed up by the backup-end device 102 and that is written by the source device 101 after the $n^{th}$ snapshot $S_n$; determine, according to a logical block address of the first data block and the version number of the snapshot $S_n$, a second data block that is recorded in the snapshot $S_n$ and that is stored in the logical block address; determine a shift amount of a cyclic shift that needs to be performed on the first data block; perform a cyclic shift on the first data block according to the shift amount to obtain a third data block; perform a logical operation on the third data block and the second data block to obtain a fourth data block; and compress the fourth data block to obtain a fifth data block, where the logical operation is an exclusive-OR operation or an exclusive-NOR operation. The interface is configured to send, to the source device 101, a data packet that carries the fifth data block, the logical block address of the first data block, and shift information, where the shift information includes a cyclic shift direction and the shift amount. Optionally, the following calculation rule is configured for the storage device 101: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows. The processor 1202 is specifically configured to perform hash calculation on at least partial data, which is in each window, of the first data block according to the calculation rule, and perform hash calculation on at least partial data, which is in each window, of the second data block according to the calculation rule; select, according to an order in which hash values are set, the first M hash values from hash values of the first data block, and select the first M hash values from hash values of the second data block, where M is a positive integer and is not greater than N; and search the first M hash values of the first data block and the first M hash values of the second data block for a same hash value, and determine that a difference between offsets of two windows corresponding to the same hash value is the shift amount. Optionally, a fixed length that a start location of an $(i+1)^{th}$ window is away from a start location of an $i^{th}$ window is one bit or multiple bits. Optionally, the order, in which the hash values are set, according to which the backup-end device performs selection may be specifically an ascending order or a descending order. Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed.

As shown in FIG. 12, an embodiment of the present disclosure provides a storage device, where the storage device serves as a source device 101 in a storage system, and the storage system further includes a backup-end device 102 of the source device 101. Reference may be made to the storage system shown in FIG. 9. Data of an $n^{th}$ snapshot $S_n$ is stored in the storage device 101, and the data of the $n^{th}$ snapshot $S_n$ in the storage device 101 and data of an $x^{th}$ snapshot $S_x$ are stored in the backup-end device 102, where n and x are integers, and n<x. The source device 101 includes an interface 1201 and a processor 1202, and the interface 1201 and the processor 1202 communicate with each other by using a bus. The interface 1201 is configured to send a data recovery request to the backup-end device 102, where the data recovery request carries a version number of the snapshot $S_n$; and receive and parse a data packet that is sent by the backup-end device 102 according to the data recovery request, to obtain a fifth data block, a logical block address of a first data block, and shift information, where the first data block is a data block that is recorded in the snapshot $S_x$ backed up by the backup-end device 102 and that is written to the logical block address by the storage device 101 after the $n^{th}$ snapshot $S_n$. The processor 1202 is configured to determine, according to the logical block address of the first data block, a second data block recorded in the snapshot $S_n$ stored in the storage device 101, where the first data block is a modified block of the second data block; decompress the fifth data block to obtain a fourth data block; perform a logical operation on the fourth data block and the second data block to obtain a third data block, where the logical operation is an exclusive-OR operation or an exclusive-NOR operation; perform a reverse cyclic shift on the third data block according to the shift information to obtain the first data block, where the shift information includes a shift amount and a cyclic shift direction that are needed by the backup-end device 102 to perform a cyclic shift on the first data block to obtain the third data block; and write the first data block to the logical block address of the first data block.

The interface 1201 and the processor 1202 in the storage device in the foregoing embodiments of the present disclosure may be of a physical structure, or may be logically divided. In specific implementation, some functions of the interface 1201 may be also implemented by the processor 1202, or may be integrated into the processor (that is, the interface is a portion of the processor). For a specific function of the storage device, reference may be made to functions of the source device 101 and the backup-end device 102 in the foregoing embodiments. Details are not described herein.

Figure 13:
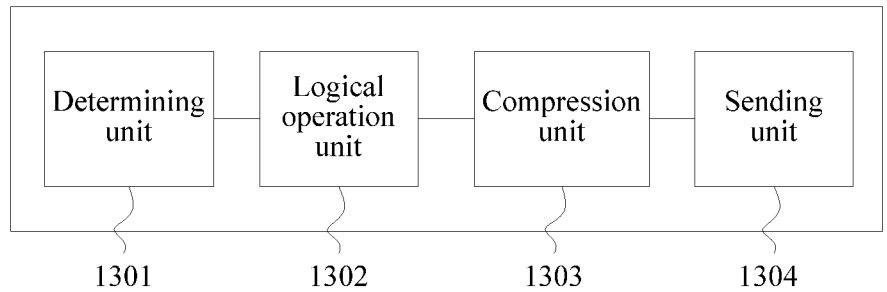
FIG. 13 is a schematic structural diagram of a storage device according to an embodiment of the present disclosure.

As shown in FIG. 13, an embodiment of the present disclosure provides a storage device, configured to serve as a source device 101 in a storage system, where the storage system further includes a backup-end device 102 of the source device 101. Reference may be made to the storage system shown in FIG. 1. Data of an $n^{th}$ snapshot $S_n$ is stored in both the storage device 101 and the backup-end device 102, where n is an integer. The storage device 101 includes a determining unit 1301, a logical operation unit 1302, a compression unit 1303, and a sending unit 1304. The determining unit 1301 is configured to determine a first data block that is written to the storage device 101 after the $n^{th}$ snapshot $S_n$; and determine, according to a logical block address of the first data block, a second data block recorded in the $n^{th}$ snapshot $S_n$, where the first data block is a modified block of the second data block. The logical operation unit 1302 is configured to perform a logical operation on the first data block and the second data block to obtain a third data block, where the logical operation is an exclusive-OR operation or an exclusive-NOR operation. The compression unit 1303 is configured to compress the third data block to obtain a fourth data block. The sending unit 1304 is configured to send, to the backup-end device 102, a data packet that carries the fourth data block, the logical block address of the first data block, and a version number of the $n^{th}$ snapshot $S_n$. Optionally, the determining unit 1301 is specifically configured to determine the first data block according to a logical block address carried in a data write request recorded in a data change log after the $n^{th}$ snapshot $S_n$. Optionally, the determining unit 1301 is specifically configured to perform an $x^{th}$ snapshot $S_x$ operation, compare the snapshot $S_n$ with a snapshot $S_x$, and determine the first data block, where n and x are integers, and n<x.

Figure 14:
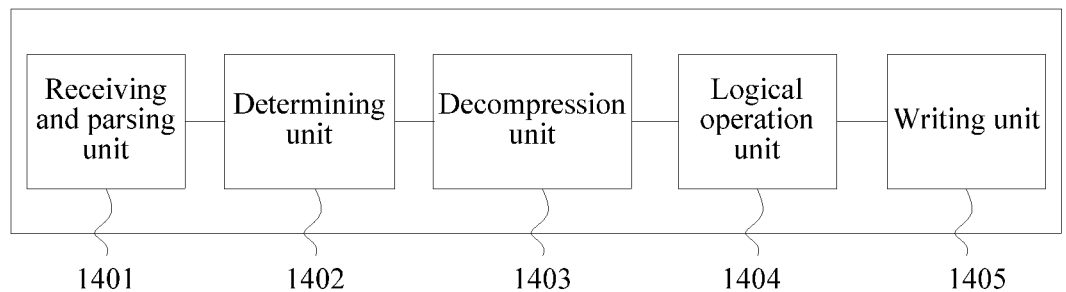
FIG. 14 is a schematic structural diagram of a storage device according to an embodiment of the present disclosure.

As shown in FIG. 14, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 1. Data of an $n^{th}$ snapshot $S_n$ is stored in both the storage device 102 and the source device 101, where n is an integer. The storage device 102 includes a receiving and parsing unit 1401, a determining unit 1402, a decompression unit 1403, a logical operation unit 1404, and a writing unit 1405. The receiving and parsing unit 1401 is configured to receive and parse a data packet sent by the source device 101, to obtain a fourth data block, a logical block address of a first data block, and a version number of the $n^{th}$ snapshot $S_n$. The determining unit 1402 is configured to determine, according to the logical block address of the first data block and the version number of the $n^{th}$ snapshot $S_n$, a second data block recorded in the snapshot $S_n$, where the first data block is a data block written by the source device 101 after the $n^{th}$ snapshot $S_n$, and the first data block is a modified block of the second data block. The decompression unit 1403 is configured to decompress the fourth data block to obtain a third data block. The logical operation unit 1404 is configured to perform a logical operation on the third data block and the second data block to obtain the first data block, where the logical operation is an exclusive-OR operation or an exclusive-NOR operation. The writing unit 1405 is configured to write the first data block to the logical block address of the first data block.

Figure 15:
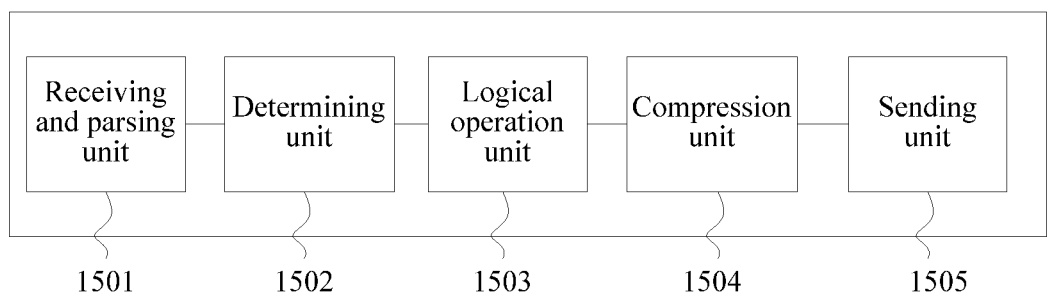
FIG. 15 is a schematic structural diagram of a storage device according to an embodiment of the present disclosure.

As shown in FIG. 15, an embodiment of the present disclosure provides a storage device, where the storage device is configured to serve as a backup-end device 102 in a storage system, and the storage system further includes a source device 101 of the backup-end device 102. Reference may be made to the storage system shown in FIG. 9. Data of an $n^{th}$ snapshot $S_n$ is stored in both the storage device 102 and the source device 101, where n is an integer. The storage device 102 includes a receiving and parsing unit 1501, a determining unit 1502, a logical operation unit 1503, a compression unit 1504, and a sending unit 1505. The receiving and parsing unit 1501 is configured to receive and parse a data recovery request sent by the source device 101, to obtain a version number of the snapshot $S_n$. The determining unit 1502 is configured to determine, according to the version number of the snapshot $S_n$ and a version number of a snapshot $S_x$, a first data block recorded in the snapshot $S_x$; and determine, according to a logical block address of the first data block and the version number of the snapshot $S_n$, a second data block that is recorded in the snapshot $S_n$ and that is stored in the logical block address, where the first data block is a data block that is recorded in the snapshot $S_x$ backed up by the storage device 102 and that is written by the source device 101 after the $n^{th}$ snapshot $S_n$, and the first data block is a modified block of the second data block. The logical operation unit 1503 is configured to perform a logical operation on the first data block and the second data block to obtain a third data block, where the logical operation is an exclusive-OR operation or an exclusive-NOR operation. The compression unit 1504 is configured to compress the third data block to obtain a fourth data block. The sending unit 1505 is configured to send, to the source device 101, a data packet that carries the fourth data block and the logical block address of the first data block.

Figure 16:
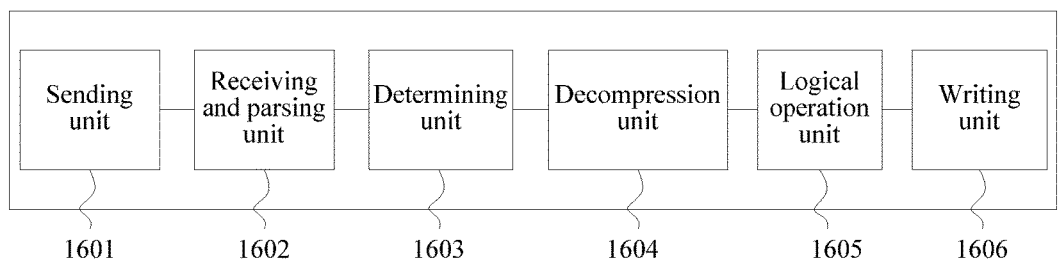
FIG. 16 is a schematic structural diagram of a storage device according to an embodiment of the present disclosure.

As shown in FIG. 16, an embodiment of the present disclosure provides a storage device, where the storage device is configured to serve as a source device 101 in a storage system, and the storage system further includes a backup-end device 102 of the source device 101. Reference may be made to the storage system shown in FIG. 9. Data of an $n^{th}$ snapshot $S_n$ is stored in both the storage device 101 and the backup-end device 102, where n is an integer. The storage device includes a sending unit 1601, a receiving and parsing unit 1602, a determining unit 1603, a decompression unit 1604, a logical operation unit 1605, and a writing unit 1606. The sending unit 1601 is configured to send a data recovery request to the backup-end device 102, where the data recovery request carries a version number of the snapshot $S_n$. The receiving and parsing unit 1602 is configured to receive and parse a data packet that is sent by the backup-end device 102 according to the data recovery request, to obtain a fourth data block and a logical block address of a first data block, where the first data block is a data block that is recorded in a snapshot $S_x$ backed up by the backup-end device 102 and that is written to the logical block address by the storage device 101 after the $n^{th}$ snapshot $S_n$. The determining unit 1603 is configured to determine, according to the logical block address of the first data block, a second data block recorded in the snapshot $S_n$ stored in the storage device 101, where the first data block is a modified block of the second data block. The decompression unit 1604 is configured to decompress the fourth data block to obtain a third data block. The logical operation unit 1605 is configured to perform a logical operation on the third data block and the second data block to obtain the first data block, where the logical operation is an exclusive-OR operation or an exclusive-NOR operation. The writing unit 1606 is configured to write the first data block to the logical block address of the first data block.

As shown in FIG. 13, another embodiment of the present disclosure provides a storage device, configured to serve as a source device 101 in a storage system, where the storage system further includes a backup-end device 102 of the source device 101. Reference may be made to the storage system shown in FIG. 1. Data of an $n^{th}$ snapshot $S_n$ is stored in both the storage device 101 and the backup-end device 102, where n is an integer. The storage device 101 further includes a shift unit 1305. A determining unit 1301 is configured to determine a first data block that is written to the storage device 101 after the $n^{th}$ snapshot $S_n$; determine, according to a logical block address of the first data block, a second data block recorded in the $n^{th}$ snapshot $S_n$, where the first data block is a modified block of the second data block; and determine a shift amount of a cyclic shift that needs to be performed on the first data block. The shift unit 1305 is configured to perform a cyclic shift on the first data block according to the shift amount to obtain a third data block. A logical operation unit 1302 is configured to perform a logical operation on the third data block and the second data block to obtain a fourth data block, where the logical operation is an exclusive-OR operation or an exclusive-NOR operation. A compression unit 1303 is configured to compress the fourth data block to obtain a fifth data block. A sending unit 1304 is configured to send, to the backup-end device 102, a data packet that carries the fifth data block, the logical block address of the first data block, shift information, and a version number of the $n^{th}$ snapshot $S_n$, where the shift information includes a cyclic shift direction and the shift amount. Optionally, the following calculation rule is configured for the storage device 101: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows. The determining unit 1301 is specifically configured to perform hash calculation on at least partial data, which is in each window, of the first data block according to the calculation rule, and perform hash calculation on at least partial data, which is in each window, of the second data block according to the calculation rule; select, according to an order in which hash values are set, the first M hash values from hash values of the first data block, and select the first M hash values from hash values of the second data block, where M is a positive integer and is not greater than N; and search the first M hash values of the first data block and the first M hash values of the second data block for a same hash value, and determine that a difference between offsets of two windows corresponding to the same hash value is the shift amount. Optionally, a fixed length that a start location of an $(i+1)^{th}$ window is away from a start location of an $i^{th}$ window is one bit or multiple bits. Optionally, the order, in which the hash values are set, according to which the backup-end device performs selection may be specifically an ascending order or a descending order. Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed.

As shown in FIG. 14, another embodiment of the present disclosure provides a storage device, where the storage device is configured to serve as a backup-end device 102 in a storage system, and the storage system further includes a source device 101 of the backup-end device 102. Reference may be made to the storage system shown in FIG. 1. Data of an $n^{th}$ snapshot $S_n$ is stored in both the storage device 102 and the source device 101, where n is an integer. The storage device 102 further includes a shift unit 1406. A receiving and parsing unit 1401 is configured to receive and parse a data packet sent by the source device 101, to obtain a fifth data block, a logical block address of a first data block, shift information, and a version number of the $n^{th}$ snapshot $S_n$. A determining unit 1402 is configured to determine, according to the logical block address of the first data block and the version number of the $n^{th}$ snapshot $S_n$, a second data block recorded in the snapshot $S_n$, where the first data block is a data block written by the source device 101 after the $n^{th}$ snapshot $S_n$, and the first data block is a modified block of the second data block. A decompression unit 1403 is configured to decompress the fifth data block to obtain a fourth data block. A logical operation unit 1404 is configured to perform a logical operation on the fourth data block and the second data block to obtain a third data block, where the logical operation is an exclusive-OR operation or an exclusive-NOR operation. The shift unit 1406 is configured to perform a reverse cyclic shift on the third data block according to the shift information to obtain the first data block, where the shift information includes a shift amount and a cyclic shift direction that are needed by the source device 101 to perform a cyclic shift on the first data block to obtain the third data block. A writing unit 1405 is configured to write the first data block to the logical block address of the first data block.

As shown in FIG. 15, another embodiment of the present disclosure provides a storage device, where the storage device is configured to serve as a backup-end device 102 in a storage system, and the storage system further includes a source device 101 of the backup-end device 102. Reference may be made to the storage system shown in FIG. 9. Data of an $n^{th}$ snapshot $S_n$ is stored in both the storage device 102 and the source device 101, where n is an integer. The storage device 102 further includes a shift unit 1506. A receiving unit 1501 is configured to receive a data recovery request sent by the source device 101, where the data recovery request carries a version number of the snapshot $S_n$. A determining unit 1502 is configured to determine, according to the version number of the snapshot $S_n$ and a version number of a snapshot $S_x$, a first data block recorded in the snapshot $S_x$, where the first data block is a data block that is recorded in the snapshot $S_x$ backed up by the storage device 102 and that is written by the source device 101 after the $n^{th}$ snapshot $S_n$; determine, according to a logical block address of the first data block and the version number of the snapshot $S_n$, a second data block that is recorded in the snapshot $S_n$ and that is stored in the logical block address; and determine a shift amount of a cyclic shift that needs to be performed on the first data block. The shift unit 1506 is configured to perform a cyclic shift on the first data block according to the shift amount to obtain a third data block. A logical operation unit 1503 is configured to perform a logical operation on the third data block and the second data block to obtain a fourth data block. A compression unit 1504 is configured to compress the fourth data block to obtain a fifth data block, where the logical operation is an exclusive-OR operation or an exclusive-NOR operation. A sending unit 1505 is configured to send, to the source device 101, a data packet that carries the fifth data block, the logical block address of the first data block, and shift information, where the shift information includes a cyclic shift direction and the shift amount. Optionally, the following calculation rule is configured for the storage device 102: N windows are set, and hash calculation is performed on at least partial data, which is in each window, of a data block, where a size of each window is the same; a start location of a first window is a start location of the data block; an end location of a last window is an end location of the data block; a start location of an $(i+1)^{th}$ window is a fixed length away from a start location of an $i^{th}$ window; and N is an integer and is not less than 2, i is an integer, and the $i^{th}$ window indicates any window of a first to an $N^{th}$ windows. The determining unit 1502 is specifically configured to perform hash calculation on at least partial data, which is in each window, of the first data block according to the calculation rule, and perform hash calculation on at least partial data, which is in each window, of the second data block according to the calculation rule; select, according to an order in which hash values are set, the first M hash values from hash values of the first data block, and select the first M hash values from hash values of the second data block, where M is a positive integer and is not greater than N; and search the first M hash values of the first data block and the first M hash values of the second data block for a same hash value, and determine that a difference between offsets of two windows corresponding to the same hash value is the shift amount. Optionally, a fixed length that a start location of an $(i+1)^{th}$ window is away from a start location of an $i^{th}$ window is one bit or multiple bits. Optionally, the order, in which the hash values are set, according to which the backup-end device performs selection may be specifically an ascending order or a descending order. Optionally, at the same time when it is determined that a difference between offsets of two windows corresponding to the same hash value is the shift amount, a cyclic shift direction may be further determined. Specifically, when an offset of a window corresponding to a same hash value in a first data block minus an offset of a window corresponding to the same hash value in a second data block is a positive number, a cyclic shift to the left is performed; or when an offset of a window corresponding to a same hash value in a first data block minus an offset of a window corresponding to the same hash value in a second data block is a negative number, a cyclic shift to the right is performed.

As shown in FIG. 16, another embodiment of the present disclosure provides a storage device, where the storage device is configured to serve as a source device 101 in a storage system, and the storage system further includes a backup-end device 102 of the source device 101. Reference may be made to the storage system shown in FIG. 9. Data of an $n^{th}$ snapshot $S_n$ is stored in both the storage device 101 and the backup-end device 102, where n is an integer. The storage device 101 further includes a shift unit 1607. A sending unit 1601 is configured to send a data recovery request to the backup-end device, where the data recovery request carries a version number of the snapshot $S_n$. A receiving and parsing unit 1602 is configured to receive and parse a data packet that is sent by the backup-end device 102 according to the data recovery request, to obtain a fifth data block, a logical block address of a first data block, and shift information, where the first data block is a data block that is recorded in a snapshot $S_x$ backed up by the backup-end device 102 and that is written to the logical block address by the storage device 101 after the $n^{th}$ snapshot $S_n$. A determining unit 1603 is configured to determine, according to the logical block address of the first data block, a second data block recorded in the snapshot $S_n$ stored in the storage device 101, where the first data block is a modified block of the second data block. A decompression unit 1604 is configured to decompress the fifth data block to obtain a fourth data block. A logical operation unit 1605 is configured to perform a logical operation on the fourth data block and the second data block to obtain a third data block, where the logical operation is an exclusive-OR operation or an exclusive-NOR operation. The shift unit 1607 is configured to perform a reverse cyclic shift on the third data block according to the shift information to obtain the first data block, where the shift information includes a shift amount and a cyclic shift direction that are needed by the backup-end device 102 to perform a cyclic shift on the first data block to obtain the third data block. A writing unit 1606 is configured to write the first data block to the logical block address of the first data block.

For the storage devices shown in FIG. 13 to FIG. 16 of the embodiments of the present disclosure, FIG. 13 is used as an example. The storage device includes a determining unit 1301, a logical operation unit 1302, a compression unit 1303, and a sending unit 1304. An implementation manner is that the foregoing units are installed in the storage device, the foregoing units may be loaded into memory of the storage device, and a central processing unit of the storage device executes an instruction in the memory, to implement a function in an embodiment corresponding to the present disclosure. Another implementation manner is that the units included in the storage device may be implemented by using hardware, or may be implemented by using a combination of software and hardware. The foregoing units are also referred to as structural units.

In the embodiments of the present disclosure, that a storage device serves as a source device or a backup-end device in a storage system refers to that the storage device may perform a function of the source device or the backup-end device in the storage system, and may have a structure that is the same as that of the source device or the backup-end device. In other words, the source device or the backup-end device in the storage system may be referred to as a storage device.

An embodiment of the present disclosure further provides a non-volatile computer readable storage medium and a computer program product. When a computer instruction included in the non-volatile computer readable storage medium and the computer program product is loaded into memory of the devices shown in FIG. 1, FIG. 9, FIG. 10, FIG. 11, and FIG. 12, a CPU executes the computer instruction loaded into the memory, to implement corresponding functions in the embodiments of the present disclosure.

In the several embodiments provided in the present disclosure, it should be understood that the disclosed apparatus and method may be implemented in other manners. For example, the unit division in the described apparatus embodiment is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separated, and parts shown as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

What is claimed is:
1. A storage device, comprising:
a data storage area;
an interface;
a processor coupled to communicate with the interface over a bus;

wherein the data storage area and a backup-end device are both configured to store data of an $n^{th}$ snapshot $S_n$, wherein n is an integer; and wherein the processor is configured to:
determine a first data block that is written to the storage device after the $n^{th}$ snapshot $S_n$;
determine, according to a logical block address of the first data block, a second data block recorded in the $n^{th}$ snapshot $S_n$, wherein the first data block is a modified block of the second data block;
determine a shift amount of a cyclic shift that needs to be performed on the first data block; perform a cyclic shift on the first data block according to the shift amount to obtain a third data block;
perform a logical operation on the third data block and the second data block to obtain a fourth data block, wherein the logical operation is an exclusive-OR operation or an exclusive-NOR operation; and
compress the fourth data block to obtain a fifth data block, wherein the interface is configured to send, to the backup-end device, a data packet that carries the fifth data block, the logical block address of the first data block, shift information, and a version number of the $n^{th}$ snapshot $S_n$, and
wherein the shift information comprises a cyclic shift direction and the shift amount.

2. The storage device according to claim 1, wherein the following calculation rule is configured for the storage device:
N windows are set, and hash calculation is performed on at least partial data, which is in each window, of a data block, wherein a size of each window is the same;
a start location of a first window is a start location of the data block;
an end location of a last window is an end location of the data block;
a start location of an $(i+1)^{th}$ window is a fixed length away from a start location of an i.sup.th window; and
N is an integer and is not less than 2, i is an integer, and the i.sup.th window indicates any window of a first to an $N^{th}$ windows; and
wherein the processor is further configured to:
perform hash calculation on at least partial data, which is in each window, of the first data block according to the calculation rule, and perform hash calculation on at least partial data, which is in each window, of the second data block according to the calculation rule;
select, according to an order in which hash values are set, the first M hash values from hash values of the first data block, and select the first M hash values from hash values of the second data block, wherein M is a positive integer and is not greater than N; and
search the first M hash values of the first data block and the first M hash values of the second data block for a same hash value, and determine that a difference between offsets of two windows corresponding to the same hash value is the shift amount.

3. The storage device according to claim 1, wherein the processor is further configured to determine the first data block according to a logical block address carried in a data write request recorded in a data change log after the $n^{th}$ snapshot $S_n$.

4. The storage device according to claim 1, wherein the processor is further configured to perform an x.sup.th snapshot $S_x$ operation on the storage device, compare the snapshot $S_n$ with a snapshot $S_x$, and determine the first data block, wherein x is an integer, and n<x.

5. A storage device, comprising:
a data storage area;
an interface;
a processor coupled to communicate with the interface over a bus;
wherein the data storage area and a source device are both configured to store data of an $n^{th}$ snapshot $S_n$, wherein n is an integer;
wherein the interface is configured to receive and parse a data packet sent by the source device, to obtain a fifth data block, a logical block address of a first data block, shift information, and a version number of the $n^{th}$ snapshot $S_n$; and
wherein the processor is configured to determine, according to the logical block address of the first data block and the version number of the $n^{th}$ snapshot $S_n$, a second data block recorded in the snapshot $S_n$, wherein the first data block is a data block written by the source device after the $n^{th}$ snapshot $S_n$, and the first data block is a modified block of the second data block; decompress the fifth data block to obtain a fourth data block; perform a logical operation on the fourth data block and the second data block to obtain a third data block, wherein the logical operation is an exclusive-OR operation or an exclusive-NOR operation; perform a reverse cyclic shift on the third data block according to the shift information to obtain the first data block, wherein the shift information comprises a shift amount and a cyclic shift direction that are needed by the source device to perform a cyclic shift on the first data block to obtain the third data block; and write the first data block to the logical block address of the first data block.

6. A storage device, comprising:
a data storage area;
an interface;
a processor coupled to communicate with the interface over a bus;
wherein the data storage area and a source device are both configured to store data of an $n^{th}$ snapshot $S_n$, wherein n is an integer;
wherein the data storage area is further configured to store data of an x.sup.th snapshot $S_x$, wherein n and x are integers, and n<x;
wherein the interface is configured to receive a data recovery request sent by the source device, wherein the data recovery request carries a version number of the snapshot $S_n$; and
wherein the processor is configured to:
determine, according to the version number of the snapshot $S_n$ and a version number of the snapshot $S_x$, a first data block recorded in the snapshot $S_x$, wherein the first data block is a data block that is recorded in the snapshot $S_x$ backed up by a backup-end device and that is written by the source device after the $n^{th}$ snapshot $S_n$;
determine, according to a logical block address of the first data block and the version number of the snapshot $S_n$, a second data block that is recorded in the snapshot $S_n$ and that is stored in a logical block address;
determine a shift amount of a cyclic shift that needs to be performed on the first data block; perform a cyclic shift on the first data block according to the shift amount to obtain a third data block;
perform a logical operation on the third data block and the second data block to obtain a fourth data block; and
compress the fourth data block to obtain a fifth data block, wherein the logical operation is an exclusive-OR operation or an exclusive-NOR operation; and wherein the interface is further configured to send, to the source device, a data packet that carries the fifth data block, the logical block address of the first data block, and shift information, wherein the shift information comprises a cyclic shift direction and the shift amount.

7. The storage device according to claim 6, wherein the following calculation rule is configured for the storage device:
N windows are set, and hash calculation is performed on at least partial data, which is in each window, of a data block, wherein a size of each window is the same;
a start location of a first window is a start location of the data block;
an end location of a last window is an end location of the data block;
a start location of an $(i+1)^{th}$ window is a fixed length away from a start location of an i.sup.th window; and
N is an integer and is not less than 2, i is an integer, and the i.sup.th window indicates any window of a first to an $N^{th}$ windows; and
wherein the processor is further configured to:
perform hash calculation on at least partial data, which is in each window, of the first data block according to the calculation rule, and perform hash calculation on at least partial data, which is in each window, of the second data block according to the calculation rule;
select, according to an order in which hash values are set, the first M hash values from hash values of the first data block, and select the first M hash values from hash values of the second data block, wherein M is a positive integer and is not greater than N; and
search the first M hash values of the first data block and the first M hash values of the second data block for a same hash value, and determine that a difference between offsets of two windows corresponding to the same hash value is the shift amount.

8. A storage device, comprising:
a data storage area;
an interface;
a processor coupled to communicate with the interface over a bus;
wherein the data storage area and a backup-end device are both configured to store data of an $n^{th}$ snapshot $S_n$ is stored in the storage device, the backup-end device is further configured to store data of an x.sup.th snapshot $S_x$ are stored in the backup-end device, wherein n and x are integers, and n<x;
wherein the interface is configured to:
send a data recovery request to the backup-end device, wherein the data recovery request carries a version number of the snapshot $S_n$; and
receive and parse a data packet that is sent by the backup-end device according to the data recovery request, to obtain a fifth data block, a logical block address of a first data block, and shift information, wherein the first data block is a data block that is recorded in the snapshot $S_x$ backed up by the backup-end device and that is written to the logical block address by the storage device after the $n^{th}$ snapshot $S_n$; and
wherein the processor is configured to:
determine, according to the logical block address of the first data block, a second data block recorded in the snapshot $S_n$ stored in the storage device, wherein the first data block is a modified block of the second data block;
decompress the fifth data block to obtain a fourth data block;
perform a logical operation on the fourth data block and the second data block to obtain a third data block, wherein the logical operation is an exclusive-OR operation or an exclusive-NOR operation;
perform a reverse cyclic shift on the third data block according to the shift information to obtain the first data block, wherein the shift information comprises a shift amount and a cyclic shift direction that are needed by the backup-end device to perform a cyclic shift on the first data block to obtain the third data block; and
write the first data block to the logical block address of the first data block.

* * * * *